United States Patent
Sun

(10) Patent No.: US 8,345,419 B2
(45) Date of Patent: Jan. 1, 2013

(54) SERVER ASSEMBLY

(75) Inventor: Zheng-Heng Sun, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 290 days.

(21) Appl. No.: 12/873,093

(22) Filed: Aug. 31, 2010

(65) Prior Publication Data

US 2011/0267767 A1    Nov. 3, 2011

(30) Foreign Application Priority Data

Apr. 29, 2010 (CN) .......................... 2010 1 0160161

(51) Int. Cl.
*H05K 5/02* (2006.01)
*G06F 1/20* (2006.01)

(52) U.S. Cl. ........... 361/679.49; 361/679.46; 361/679.5; 361/690; 361/692; 454/184

(58) Field of Classification Search ............. 361/679.46, 361/679.49, 679.5, 690, 692; 454/184
See application file for complete search history.

(56) References Cited

U.S. PATENT DOCUMENTS

| | | | | |
|---|---|---|---|---|
| 6,765,795 B2 * | 7/2004 | Modica | ........................ | 361/695 |
| 7,023,696 B2 * | 4/2006 | Ko | ............................... | 361/695 |
| 7,259,961 B2 * | 8/2007 | Lucero et al. | ................. | 361/695 |
| 7,751,189 B2 * | 7/2010 | Ahuja et al. | ................... | 361/697 |
| 7,813,121 B2 * | 10/2010 | Bisson et al. | ............. | 361/679.51 |
| 7,862,410 B2 * | 1/2011 | McMahan et al. | ............ | 454/184 |
| 2002/0055329 A1 * | 5/2002 | Storck et al. | .................... | 454/186 |
| 2002/0108386 A1 * | 8/2002 | Spinazzola et al. | .......... | 62/259.2 |
| 2002/0173267 A1 * | 11/2002 | Sharp et al. | .................... | 454/184 |
| 2003/0030976 A1 * | 2/2003 | Garnett et al. | ................ | 361/683 |
| 2004/0184233 A1 * | 9/2004 | Yamada | ........................ | 361/690 |
| 2005/0237716 A1 * | 10/2005 | Chu et al. | ...................... | 361/696 |
| 2005/0250435 A1 * | 11/2005 | Sharp et al. | ................... | 454/184 |
| 2008/0180908 A1 * | 7/2008 | Wexler | .......................... | 361/690 |
| 2008/0204996 A1 * | 8/2008 | Sun | ................................ | 361/694 |
| 2008/0239659 A1 * | 10/2008 | Kundapur | ..................... | 361/687 |
| 2009/0303678 A1 * | 12/2009 | Ishimine et al. | ......... | 361/679.48 |
| 2009/0308579 A1 * | 12/2009 | Johnson et al. | ......... | 165/104.34 |
| 2010/0078157 A1 * | 4/2010 | Roth | ......................... | 165/104.34 |
| 2010/0151781 A1 * | 6/2010 | Slessman et al. | ............. | 454/184 |
| 2011/0096498 A1 * | 4/2011 | Tambe | .......................... | 361/695 |
| 2011/0261527 A1 * | 10/2011 | Sun et al. | ................. | 361/679.49 |
| 2011/0267770 A1 * | 11/2011 | Sun | ........................... | 361/679.49 |

* cited by examiner

*Primary Examiner* — Anatoly Vortman
(74) *Attorney, Agent, or Firm* — Altis Law Group, Inc.

(57) ABSTRACT

A server assembly includes a first server and a first airflow guiding pipe. The first server comprises a front wall. An input hole is defined in the front wall. A first input opening and a first output opening are defined in the first airflow duct. The first output opening corresponds to the input hole so as to guide airflow into the inner of the first server to dissipate heat generated by the first server. The first airflow guiding pipe is connected to the first input opening of the first airflow duct, the first airflow guiding pipe is configured to receive and guide airflow into the first airflow duct.

15 Claims, 5 Drawing Sheets

SERVER ASSEMBLY

This application is related to co-pending U.S. patent application entitled "SERVER HEAT DISSIPATION SYSTEM", U.S. application Ser. No. 12/873,104 filed on Aug. 31, 2010.

BACKGROUND

1. Technical Field

The present disclosure relates to server assemblies.

2. Description of Related Art

Typically, a plurality of servers is mounted in a server cabinet. Each server includes a heat dissipating device only dissipating heat from the corresponding server, which makes heat dissipation efficiency low overall in the server cabinet. Also, because heat dissipating devices include a lot of fans, a lot of noise is produced.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
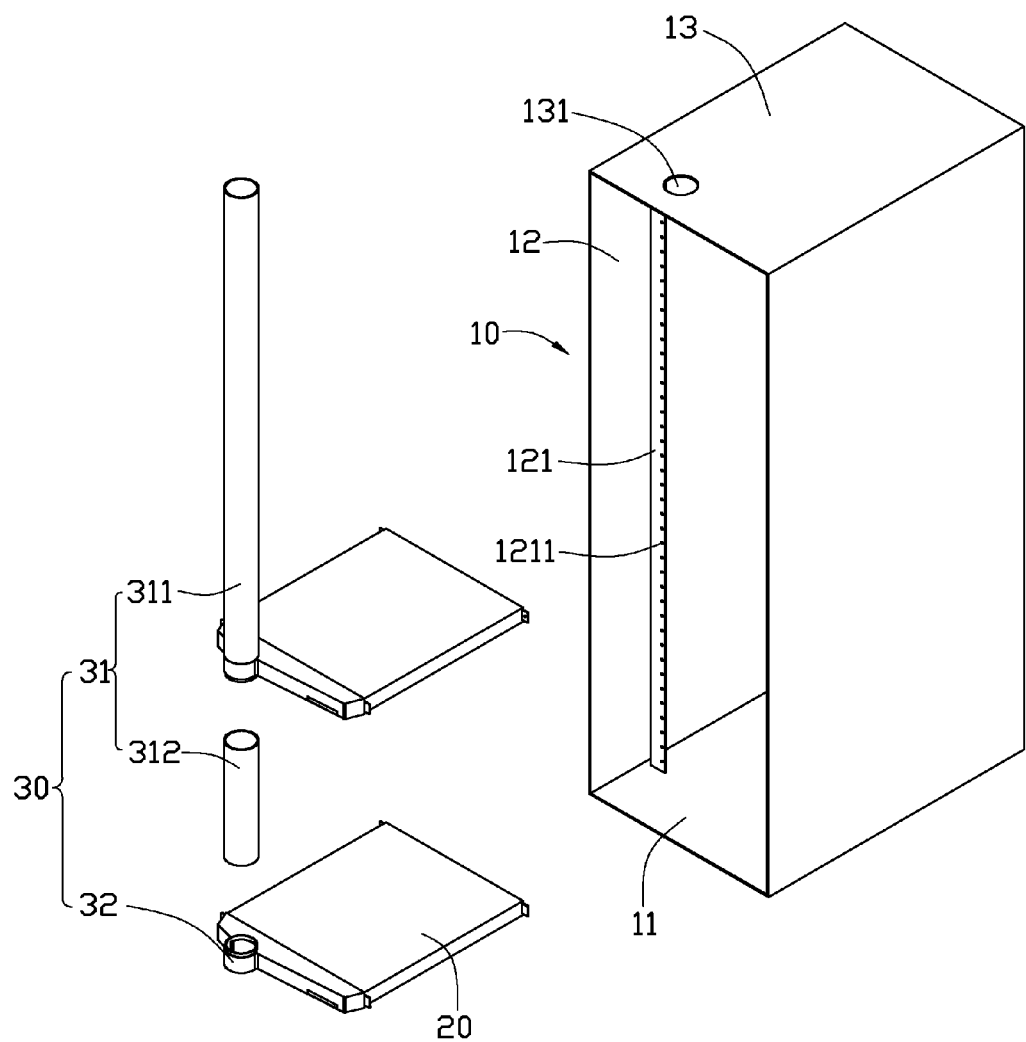
FIG. 1 is an exploded, isometric view of a server assembly of an embodiment, the server assembly including airflow ducts and servers.

Referring to FIG. 1 a server assembly includes a server cabinet 10, two servers 20, and an airflow guiding device 30.

The server cabinet 10 includes a bottom panel 11, two side panels 12 perpendicular to the bottom panel 11, and a top panel 13 parallel to the bottom panel 11. Each side panel 12 includes a mounting edge 121 extending towards the other side panel 12. A plurality of mounting holes 1211 is defined in each mounting edge 121. A through hole 131 is defined in the top panel 13.

Figure 2:
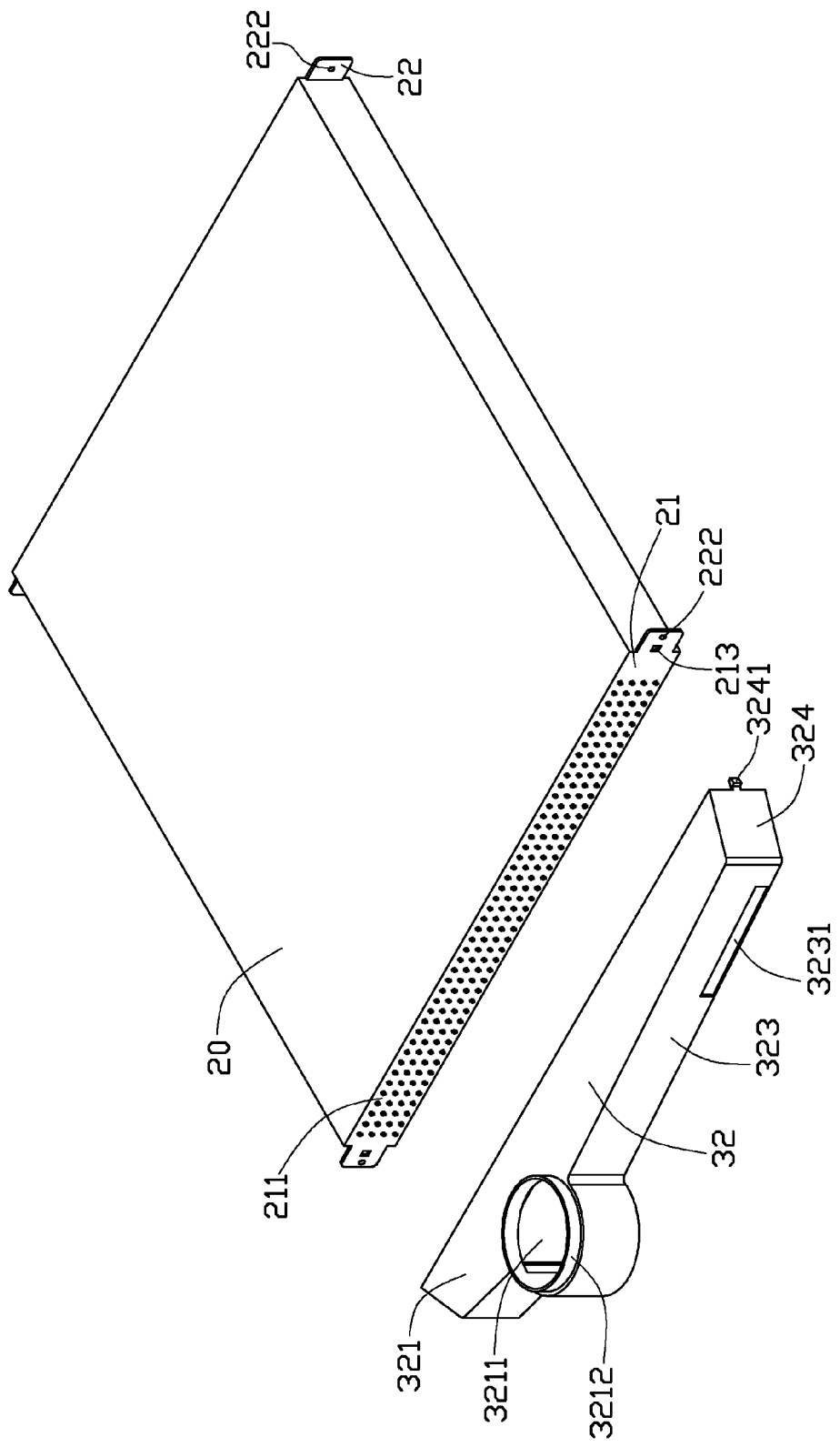
FIG. 2 is an exploded, isometric view of an airflow duct and a server of FIG. 1.
Figure 3:
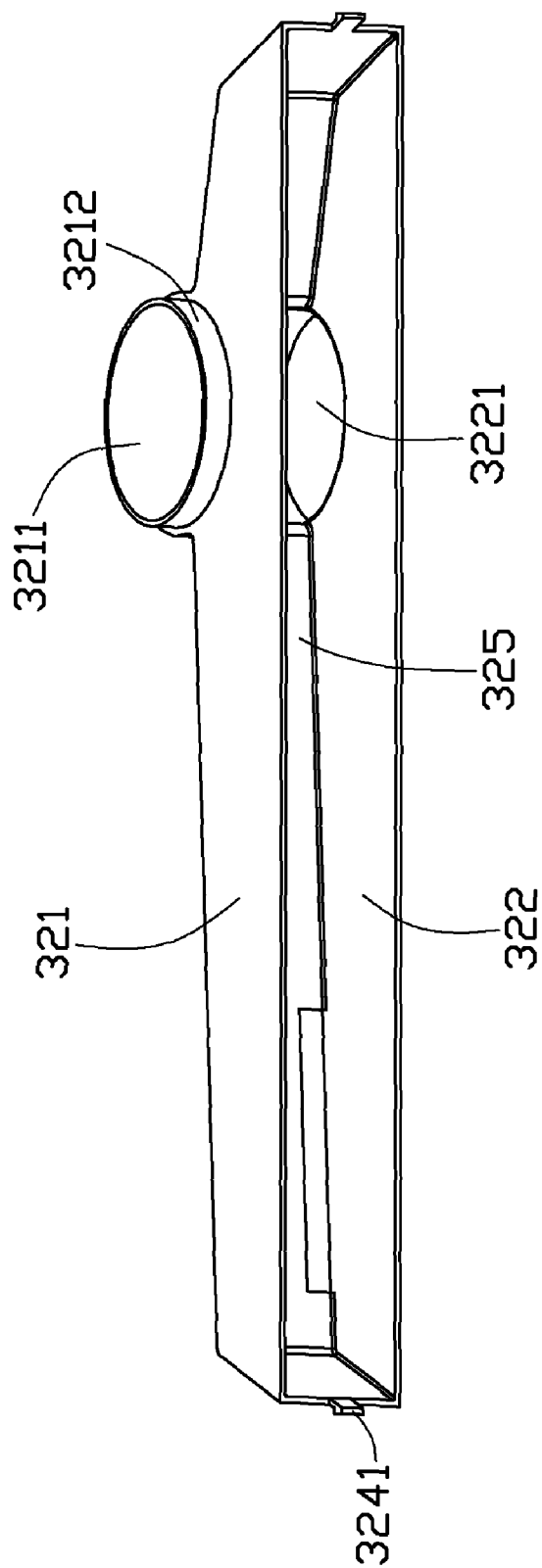
FIG. 3 is an isometric view of the airflow duct of FIG. 2.
Figure 4:
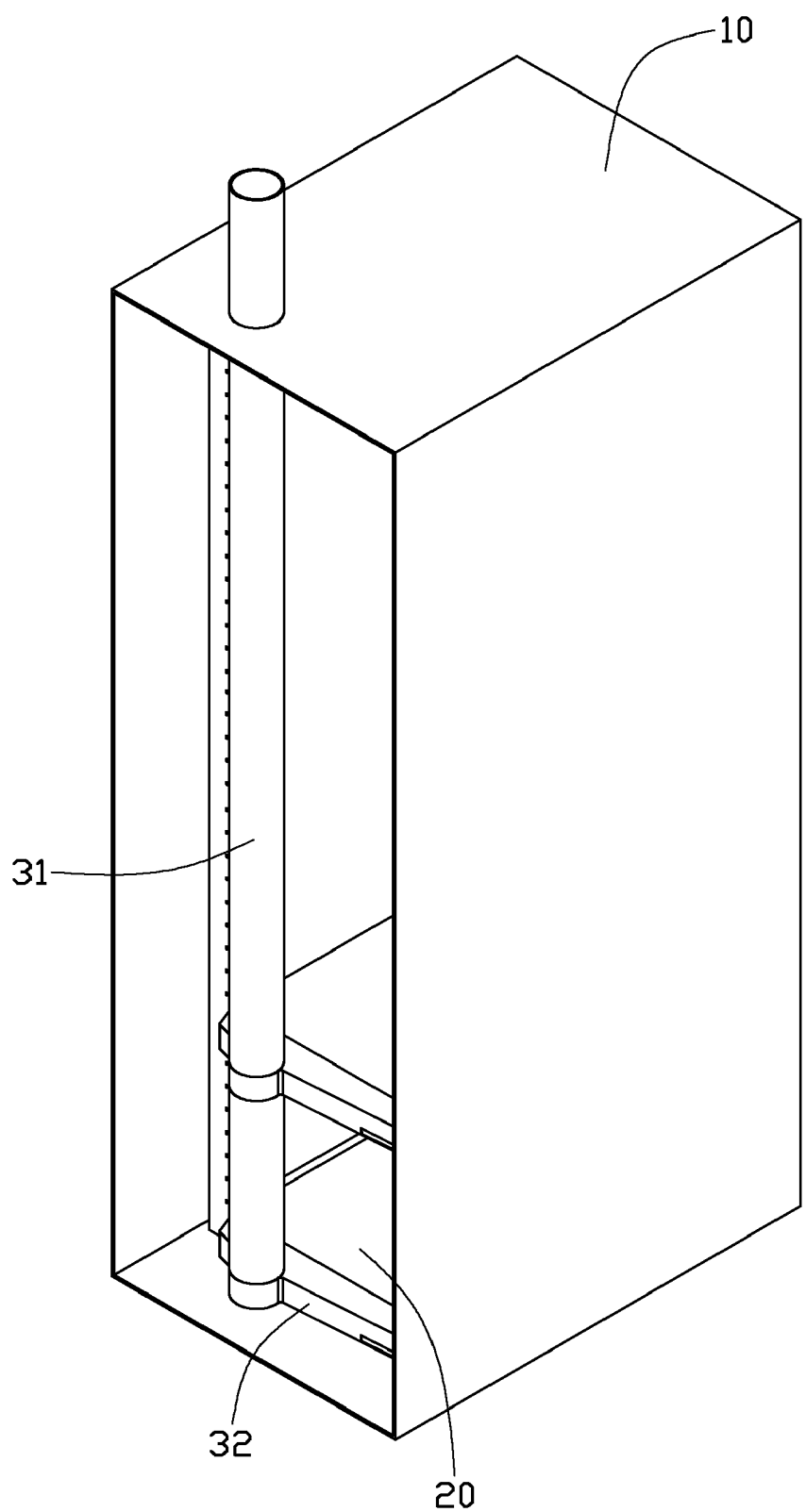
FIG. 4 is an assembled view of the disk drive assembly of FIG. 1.

Referring to FIGS. 1 to 3, the airflow guiding device 30 includes an airflow guiding pipe assembly 31 and two airflow ducts 32 connected to the airflow guiding pipe assembly 31. Each airflow duct 32 corresponds to a server 20.

The airflow guiding pipe assembly 31 includes a first airflow guiding pipe 311 and a second airflow guiding pipe 312. The extending direction of the first or second airflow guiding pipe 311, 312 is perpendicular to the bottom panel 11 of the server cabinet 10. The first airflow guiding pipe 311 is connected between one airflow duct 32 and an airflow generating device (not shown), such as a fan. The first airflow guiding pipe 311 is capable of extending through the through hole 131 of the server cabinet 10. The second airflow guiding pipe 312 is capable of being connected between the two airflow ducts 32. The airflow guiding pipe assembly 31 is configured to guide airflow from the airflow generating device to the two airflow ducts 32. In one embodiment, the airflow guiding device 30 includes three airflow ducts 32 and the airflow guiding pipe assembly 31 includes two first airflow guiding pipe 311. Each first airflow guiding pipe 311 is connected between two adjacent airflow duct 32. Additional airflow ducts 32 can be added as needed to accommodate additional servers.

Each airflow duct 32 includes a top plate 321; a bottom plate 322, parallel to the top plate 321; a first side plate 323, connected between the top plate 321 and the bottom plate 322; and two second side plates 324 connected between the top plate 321 and the bottom plate 322. An output opening 325 is cooperatively defined by the top plate 321, the bottom plate 322, and the two second side plates 324. An input opening 3211 is defined in the top plate 321. The top plate 321 includes a flange 3212 surrounding the input opening 3211. The flange 3212 is capable of being received in the first or second airflow guiding pipe 311,312 to connect the first or second airflow guiding pipe 311, 312 with the airflow duct 32. A connecting opening 3221 is defined in the bottom plate 322. The connecting opening 3221 is aligned with the input opening 3211. The second airflow guiding pipe 312 is capable of being connected between the connecting opening 3221 of one airflow duct 32 and the input opening 3211 of the other airflow duct 32. A slot 3231 is defined in the first side panel 323. A plurality of connecting cables (not shown) connected to the servers 20 is capable of being received in the slot 3231. Each second side plate 324 includes a securing portion 3241 that extends towards the corresponding server 20.

Each server 20 includes a front wall 21 and four mounting portions 22 extending from four corners of the server 20. A plurality of airflow input holes 211 is defined in the front wall 21. The airflow input holes 211 respectively correspond to the output opening 325 of the corresponding airflow duct 32. A second mounting hole 222 corresponding to one of the first mounting holes 1211 of the server cabinet 10 is defined in each mounting portion 22. Two securing holes 213 are defined in the front wall 21 corresponding to the securing portions 3241 of the airflow duct 32.

Referring to FIGS. 1 through 4, in assembly, the second mounting holes 222 of the servers 20 are respectively aligned with the first mounting holes 1211 of the server cabinet 10. A plurality of securing elements (not shown), such as screws, is secured into the second mounting holes 222 and the corresponding first mounting holes 1211, thereby securing the servers 20 to the server cabinet 10. The first airflow guiding pipe 311 is connected to the input opening 3211 of one airflow duct 32 and extends through the through hole 131 of the server cabinet 10. The second airflow guiding pipe 312 is connected between two airflow ducts 32. The securing portions 3241 respectively engage with the corresponding securing holes 213 of the servers 20.

Figure 5:
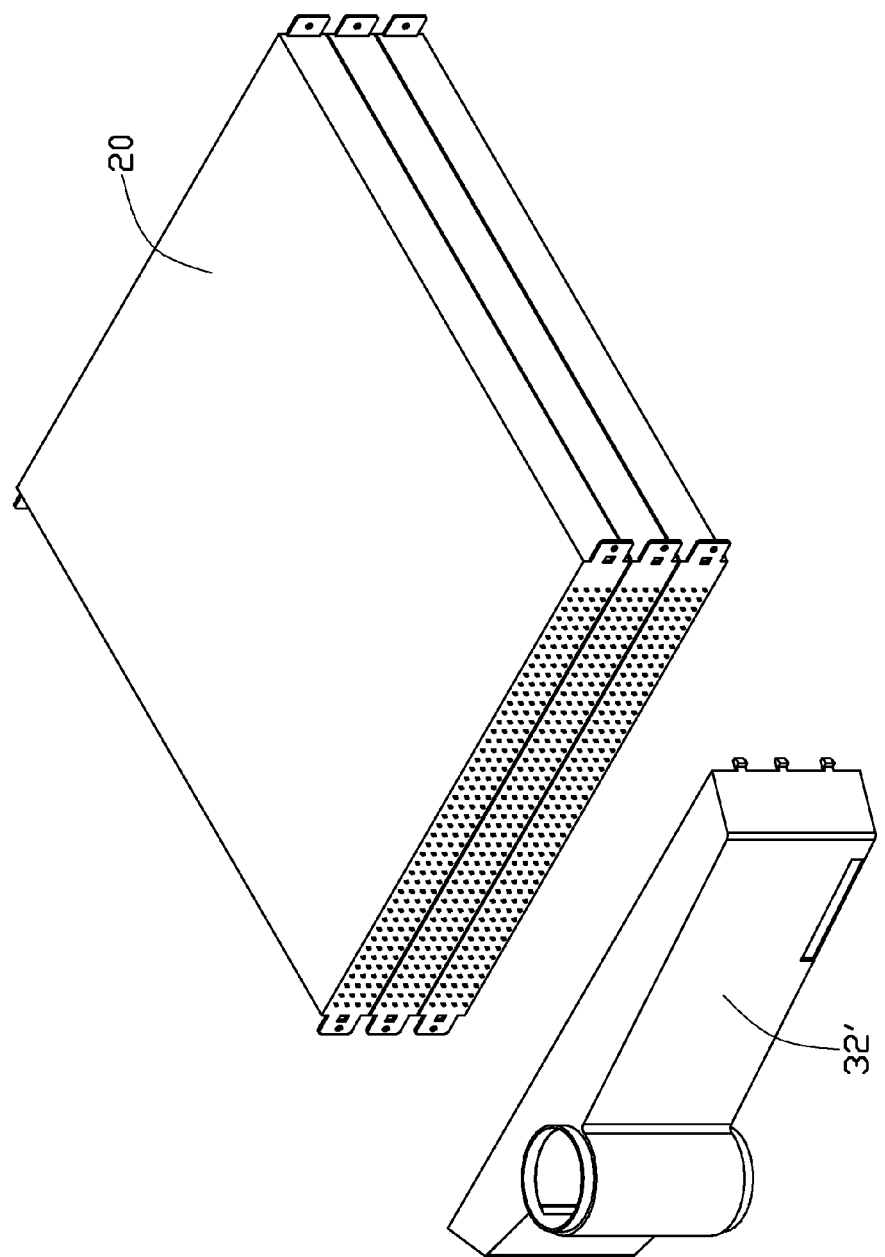
FIG. 5 is an isometric view of an airflow duct of another embodiment.

Referring to FIG. 5, an airflow duct 32' is designed to correspond to a server module including three servers 20. The airflow duct 32' can also be designed with different sizes to correspond to servers with different sizes.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server assembly comprising:
a first server, the first server comprising a front wall, an input hole defined in the front wall;

a first airflow duct; a first input opening and a first output opening defined in the first airflow duct; the first output opening corresponds to the input hole so as to guide airflow into the inner of the first server to dissipate heat generated by the first server;

a first airflow guiding pipe, the first airflow guiding pipe is connected to the first input opening of the first airflow duct, and the first airflow guiding pipe is configured to receive and guide airflow into the first airflow duct; and a second server, a second airflow guiding pipe, and a second airflow duct a connecting opening is defined in the first airflow duct a second input opening and a second output opening are defined in the second airflow duct the second output opening extends towards the second server, the second airflow guiding pipe is connected between the connecting opening and the second input opening, the second airflow guiding pipe configured to guide airflow from the first airflow duct to the second airflow duct.

2. The server assembly of claim 1, wherein the connecting opening is aligned with the first input opening.

3. The server assembly of claim 1, wherein the first airflow duct covers the front wall.

4. The server assembly of claim 3, wherein a securing hole is defined in the front wall, and the first airflow duct comprises a securing portion engaging the securing hole.

5. The server assembly of claim 3, wherein the first airflow duct comprises a top plate, a bottom plate, and two side plates; the first output opening is cooperatively defined by the top plate, the bottom plate, and the two side plates; and each side plate comprises a securing portion that extends towards the first server, and two securing holes are defined in the front wall and respectively engages the securing portions.

6. The server assembly of claim 1, wherein a slot is defined in the first airflow duct, and the slot is configured to receive a connecting cable connected to the first server.

7. The server assembly of claim 1, wherein the first airflow duct comprises a flange surrounding the first input opening, and the flange is received in the first airflow guiding pipe to connect the first airflow duct with the first airflow guiding pipe.

8. The server assembly of claim 1, further comprising a second server, the first airflow duct and the first output opening corresponds to the second server.

9. A server assembly comprising:
a server cabinet configured to receive a first server;
a first airflow duct, a first input opening and a first output opening defined in the first airflow duct, the first output opening configured to correspond to the first server; and
a first airflow guiding pipe, the first airflow guiding pipe connected to the first input opening of the first airflow duct, and the first airflow guiding pipe is configured to receive and guide airflow to the first airflow duct;
wherein the first airflow duct comprises a top plate, a bottom plate, and two side plates; and the first output opening is cooperatively defined by the top plate, the bottom plate, and the two side plates.

10. The server assembly of claim 9, further comprising a second airflow guiding pipe and a second airflow duct; a connecting opening is defined in the first airflow duct; a second input opening and a second output opening are defined in the second airflow duct; the server cabinet is configured to receive a second server, and the second output opening is configured to correspond to the second server; the second airflow guiding pipe is connected to the connecting opening and the second input opening; the second airflow guiding pipe is configured to guide airflow from the first airflow duct to the second airflow duct.

11. The server assembly of claim 10, wherein the connecting opening is aligned with the first input opening.

12. The server assembly of claim 9, wherein a slot is defined in the first airflow duct, and the slot is configured to receive connecting cables connected to the first server.

13. The server assembly of claim 9, wherein the first airflow duct comprises a flange surrounding the first input opening, and the flange is received in the first airflow guiding pipe to connect the first airflow duct with the first airflow guiding pipe.

14. A server assembly comprising:
a server cabinet configured to receive a plurality of servers;
a first airflow duct, a first input opening and a first output opening defined in the first airflow duct, the first output opening configured to correspond to the plurality of servers;
a first airflow guiding pipe, the first airflow guiding pipe connected to the first input opening of the first airflow duct, and the first airflow guiding pipe is configured to receive and guide airflow to the first airflow duct; and
wherein the first airflow duct comprises a top plate, a bottom plate, and two side plates; and the first output opening is cooperatively defined by the top plate, the bottom plate, and the two side plates.

15. The server assembly of claim 14, wherein the first airflow duct comprises a flange surrounding the first input opening, and the flange is received in the first airflow guiding pipe to connect the first airflow duct with the first airflow guiding pipe.

* * * * *